(12) United States Patent
Chien

(10) Patent No.: US 8,599,029 B2
(45) Date of Patent: Dec. 3, 2013

(54) ELECTRICAL CIRCUIT IDENTIFICATION MEANS

(75) Inventor: Shih-Hsiang Chien, Changhua County (TW)

(73) Assignee: Peaceful Thriving Enterprise Co., Ltd., Changhua County (TW)

( * ) Notice: Subject to any disclaimer, the term of this patent is extended or adjusted under 35 U.S.C. 154(b) by 180 days.

(21) Appl. No.: 13/311,554

(22) Filed: Dec. 6, 2011

(65) Prior Publication Data

US 2013/0141244 A1    Jun. 6, 2013

(51) Int. Cl.
- *G08B 21/00* (2006.01)
- *G01R 19/00* (2006.01)
- *G01R 19/14* (2006.01)
- *G01R 31/08* (2006.01)
- *G01R 31/12* (2006.01)

(52) U.S. Cl.
USPC ............... 340/644; 340/659; 324/66; 324/67; 324/657; 324/659

(58) Field of Classification Search
None
See application file for complete search history.

(56) References Cited

U.S. PATENT DOCUMENTS

| | | | | |
|---|---|---|---|---|
| 3,924,179 A * | 12/1975 | Dozier | ............................ | 324/66 |
| 4,556,839 A * | 12/1985 | George | ............................ | 324/66 |
| 5,481,185 A * | 1/1996 | Lane et al. | ..................... | 324/145 |
| 5,497,094 A * | 3/1996 | George | ............................ | 324/529 |
| 6,163,144 A * | 12/2000 | Steber et al. | .................... | 324/67 |
| 6,933,712 B2 * | 8/2005 | Miller et al. | ..................... | 324/67 |

* cited by examiner

*Primary Examiner* — Julie Lieu
(74) *Attorney, Agent, or Firm* — Raymond Y. Chan; David and Raymond Patent Firm

(57) ABSTRACT

An electrical circuit identification means is revealed. The electrical circuit identification device includes a signal generator connected directly to an AC power socket and a signal receiver set in a power control panel. The signal generator blocks a half cycle of sine waves and produces a short off-and-off signal at an interval. The signal receiver includes a signal sensor receiving signals from the signal generator and connected to both a control voltage divider and a signal strength switch for modulating and amplifying signals received by the control voltage divider, and a signal integration module that is connected to the signal strength switch and a microcontroller for outputting digital signals with different waveform. An identification system in the microcontroller cross checks the digital signals and the identification accuracy is determined according to the position of a light lit up in an indicator light module.

11 Claims, 8 Drawing Sheets

ELECTRICAL CIRCUIT IDENTIFICATION MEANS

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

1. Field of Invention

The present invention relates to an electrical circuit identification means, especially to electrical circuit identification means by which the position of a socket at a remote end that is corresponding to each main power switch and connected to the same circuit in a power control panel can be found out under the condition that the circuit is conducted.

2. Description of Related Arts

Refer to U.S. Pat. No. 3,924,179 "Method for certifying dead cables or conductors by determining current pulse polarity", a DC pulse transmitter 20 is connected through test lead 21 "A" to conductor 23 under test while clamp-on jaws 51 of DC pulse receiver 50 are clamped around the conductor 23 under test to receive signals from the DC pulse transmitter 20 for certifying a dead conductor or cable.

In the above method and apparatus, a dead insulated electrical conductor among a plurality of conductors is certified by determining the polarity of a net DC pulse in the conductor. Only a dead conductor or cable can be detected. As to conductive circuit, the prior art is unable to determine relationship between main power switches and power sockets.

Refer to U.S. Pat. No. 5497094 "Electrical circuit identification means", a transmitter is plugged into the receptacle of the line to be traced. Getting power from this line, the transmitter imparts to this line, a spike by virtue of the sudden application of an uncharged capacitor of the transmitter as a momentary "short-circuit" load to this line. The pulse thus produced is detectable by a receiver. By a blinking indicator light or a sounding buzzer, a line or lines carrying the load current is located.

The receiver uses a pickup coil to receive the pulse. However, if there are some other lines, mobile phones, computers or other electronics in use near the line/line under test, the electrical signals generated cause interference problem. Thus the receiver has errors in identifying the signals received and the detection accuracy is reduced.

Refer to U.S. Pat. No. 6,163,144 "Electrical circuit tracing apparatus using modulated tracing signal", an electrical circuit tracing apparatus includes a transmitter being connected to the circuit to be identified such as a power socket and a receiver placed in proximity to the circuit such as power control panel to find out the elements of the circuit such as main power switches. The transmitter has an electrical current signal generator including a low frequency oscillator and a high frequency gated oscillator modulated by the low frequency oscillator and a current modulator. Thus a high frequency current signal is induced in the circuit that is modulated at the low frequency. The receiver has a circuit including an inductive pick-up that is tuned to the high frequency so as to induce in the puck-up a current of the high frequency when the coil is excited by the magnetic field of the circuit. The receiver further has a signal strength indicator such as a line of LED lights is used to signal users and the signal strength varies in accordance with the magnitude of the current in the pick-up.

By low frequency signals as carrier, high frequency signals are transmitted and received by the transmitter and the receiver mentioned above. Thus the manufacturing cost is high.

Thus there is room for improvement and there is a need to provide an electrical circuit identification means that overcomes the above shortcomings and has high accuracy.

SUMMARY OF THE PRESENT INVENTION

Therefore it is a primary object of the present invention to provide an electrical circuit identification means in which a signal generator is with simple circuit design without high frequency/low frequency modulations so that the manufacturing cost is reduced.

It is another object of the present invention to provide an electrical circuit identification means in which a signal receiver converts analog signals received into digital signals for reducing interference of noises. Then time and signals of the converted digital signals are cross checked by a firmware in a microcontroller so that the signal identification ability is increased.

In order to achieve the above objects, an electrical circuit identification means of the present invention includes a signal generator and a signal receiver. The signal generator is directly connected to an AC power socket and is used to block one half input sine waves of the AC power source and leave only positive half cycle of sine waves. After an interval, an off-and-on signal is generated. Thus a waveform having the positive half cycle of sine waves and the off-and-on waves is obtained. Compare the waveform having the positive half cycle of sine waves and the off-and-on waves with the sine waves of general AC power, there is an obvious difference.

The signal receiver is set at an area arranged with a plurality of main power switches in a power control panel or set nearby cables connected to a power socket under test. The signal receiver receives the waveform having the positive half cycle of sine waves and the off-and-on waves from the signal generator. After two stage signal amplification, analog signals are converted into digital signals and are sent to a microcontroller connected thereof. The signals are cross checked by a firmware of an identification system in the microcontroller. At last, the identification accuracy depends on the position of a light lit up in an indicator light module that includes a line of indicator lights arranged into a row vertically. In use, only one of the indicator lights is lit up and the position of the indicator light lit up represents the accuracy of the detection.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

An electrical circuit identification means is used to detect a plurality of main power switches in a power control panel and respective power socket connected at a rear end so as to find out the power socket corresponding to each main power switch.

Figure 1:
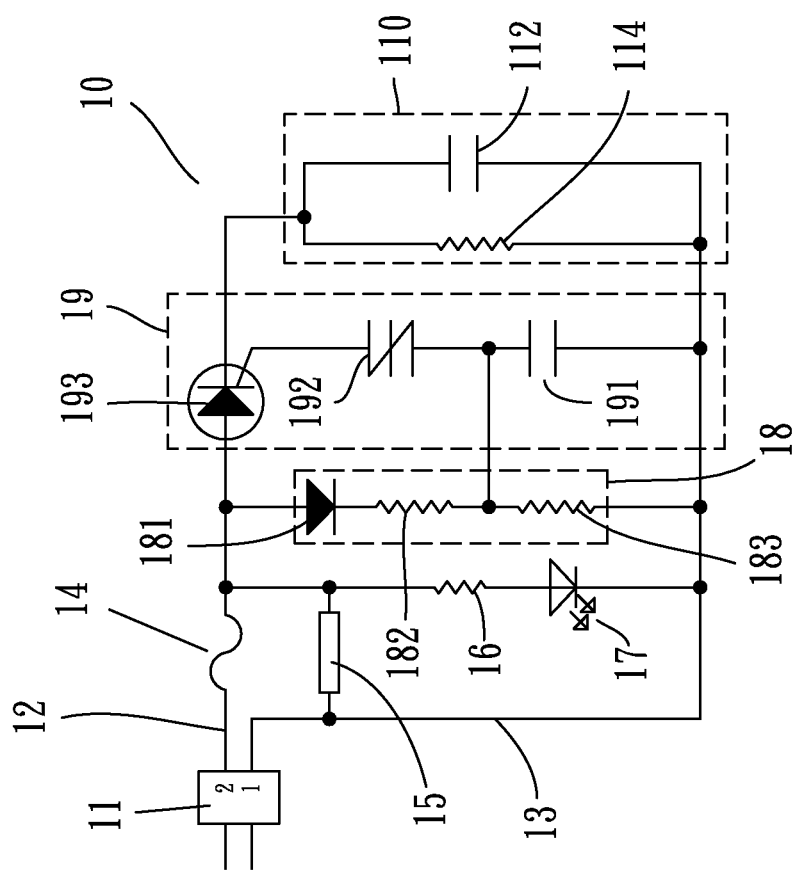
FIG. 1 is a circuit diagram of a signal generator of an embodiment according to the present invention.
Figure 4:
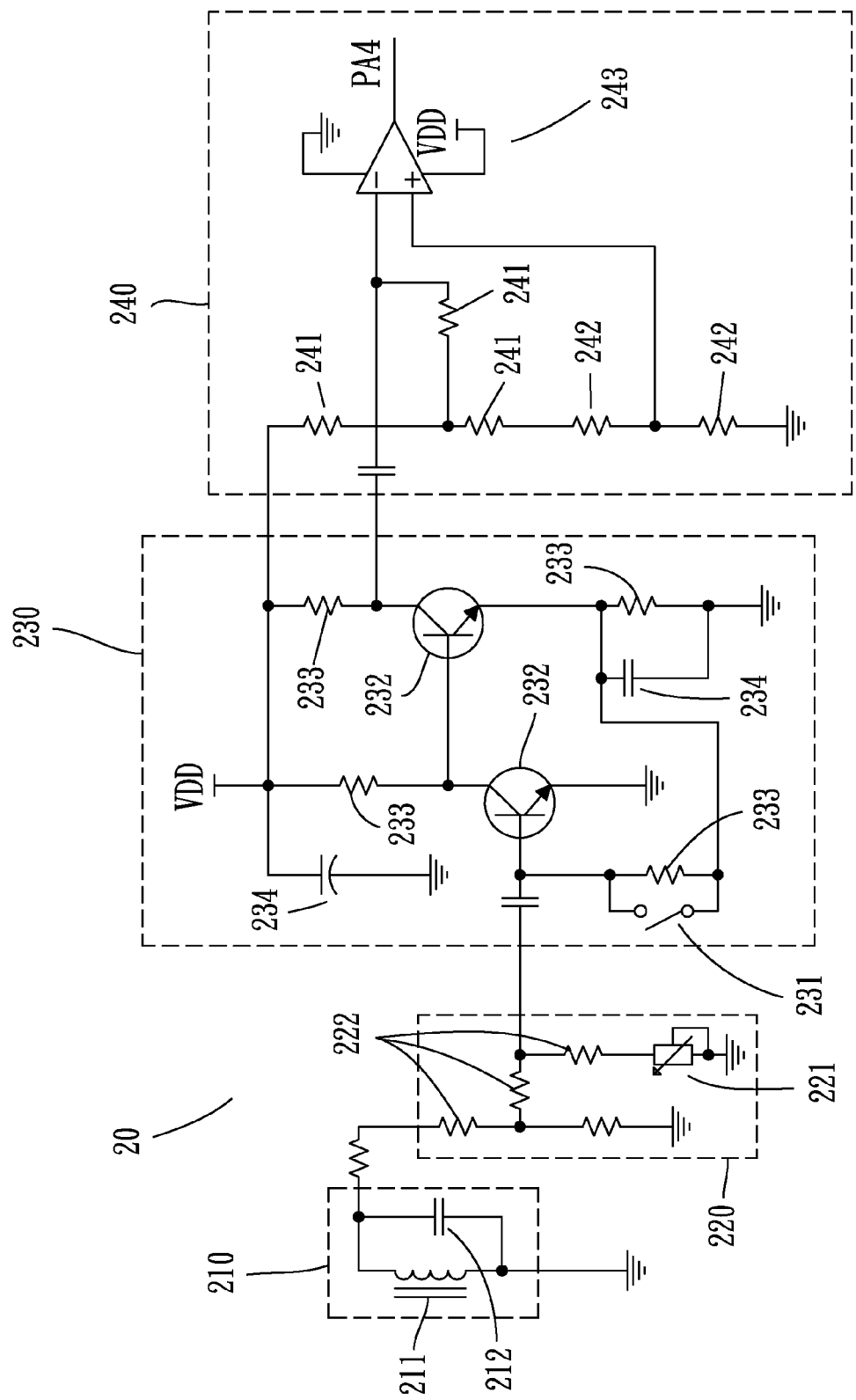
FIG. 4 is a circuit diagram of a signal receiver of an embodiment according to the present invention.

Refer to FIG. 1 and FIG. 4, an electrical circuit identification means of the present invention includes a signal generator 10 and a signal receiver 20.

The signal generator 10 consists of a power plug 11, a half-sine pulse generation module 18, a periodic power off and on module 19, and a signal transmitting module 110.

One end of the power plug 11 is directly connected to an AC power socket (not shown in figure) while the other end is connected to two wires 12, 13. The two wires 12, 13 are respectively connected to a fuse 14 and a thermistor 15 for power off protection while an abnormal current passes. A resistor 16 and a LED 17 connected in series are connected between the two wires 12, 13 in parallel. Whether the power is on is checked by lighting of the LED 17.

Figure 2:
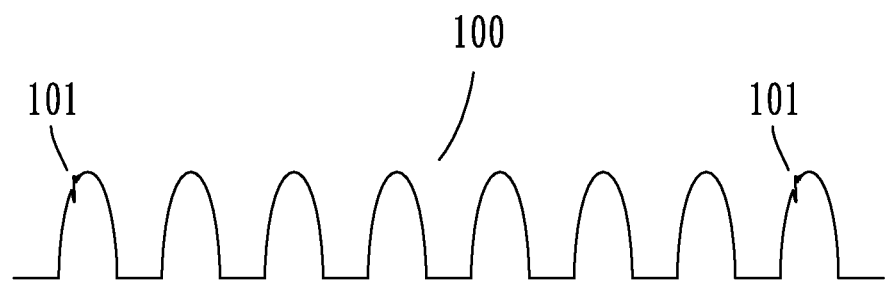
FIG. 2 is a schematic drawing showing waves produced by a signal generator of an embodiment according to the present invention.

The half-sine pulse generation module 18 is composed of a rectification diode 181 and two resistors 182, 183. The two ends of the half-sine pulse generation module 18 are respectively connected to the wires 12, 13. The half-sine pulse generation module 18 removes a half cycle of sine waves of an AC power source and only a positive half cycle of sine waves 100 of the AC power is passed. As shown in FIG. 2, a waveform chart generated by the signal generator 10 of this embodiment is revealed.

Figure 3:
FIG. 3 is a partial enlarged view of the waves in FIG. 2 showing an off-and-on wave according to the present invention.

The periodic power off and on module 19 is connected to the two wires 12, 13 of the half-sine pulse generation module 18. The periodic power off and on module 19 includes a silicon-controlled rectifier (SCR) 193, a silicon diode for alternating current (SIDAC) 192 and a capacitor 191 connected in series by a wire. When the capacitor 193 is charged by a part of current to reach a certain voltage, the SIDAC 192 is conducted and the current flows into the SCR 193 immediately. Thus the SCR 193 features on that a short power-off occurs at regular intervals. That means the power is on immediately after the short power-off. In the blocked half-sine waves 100, an off-and-on wave 101 with abnormal waveform occurs after a certain number of half-sine waves 100, as shown in FIG. 2 and FIG. 3. FIG. 3 is an enlarged view of the off-and-on wave 101.

After the periodic power off and on module 19, the signal transmitting module 110 having a capacitor 112 and a resistor 114 is also connected to the two wires 12, 13. The half-sine waves 100 and the off-and-on wave 101 mentioned above are transmitted by the signal transmitting module 110. The waveform on FIG. 3 is not completely done by SCR 193, it is done by the signal transmitting module 110. The SCR 193 is like a fast reaction selector. The SCR 193 will let the power go through the signal transmitting module 110 only for a short period and so cause the waveform on FIG. 3. This will happen when the capacitor 191 is completely charged, and the capacitor 191 will only be fully charged for a very short period so that the SCR will only be turned on for a very short period. In other words, the SCR 193 is used to control the appearance time of the waveform in FIG. 3 while the signal transmitting module 110 is used to produce the waveform on FIG. 3.

In the above signal generator 10, only the positive half cycle of the AC waves is passed while the other half is blocked. A short off-and-on wave 101 is generated every couple of half-sine waves. Thus a larger difference between full-sine signals generated by surrounding AC powers and the signals generated by the present invention is made and used as a basis for detection and identification.

The design of the signal generator 10 according to the present invention only simply changes waveforms of full-sine waves of the AC power. Compared with the techniques available now, the circuit design is simple and the manufacturing cost is lower. Moreover, the signal generator 10 of the present invention can be applied to 110V or 220V AC power. For applications to higher voltage, only several resistors are modified. Thus the applicability of the present invention is wider.

Figure 10:
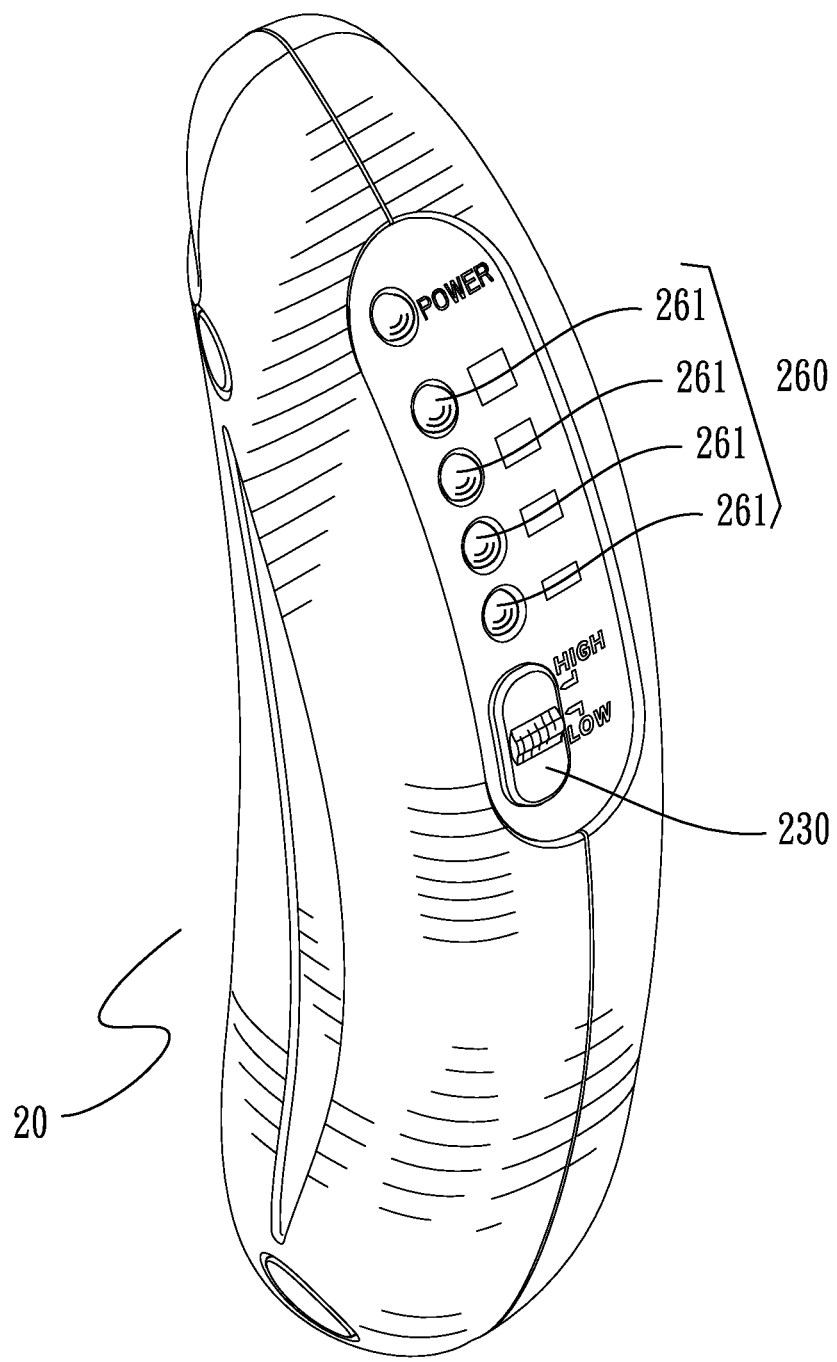
FIG. 10 is a perspective view of a signal receiver of an embodiment according to the present invention.
Figure 11:
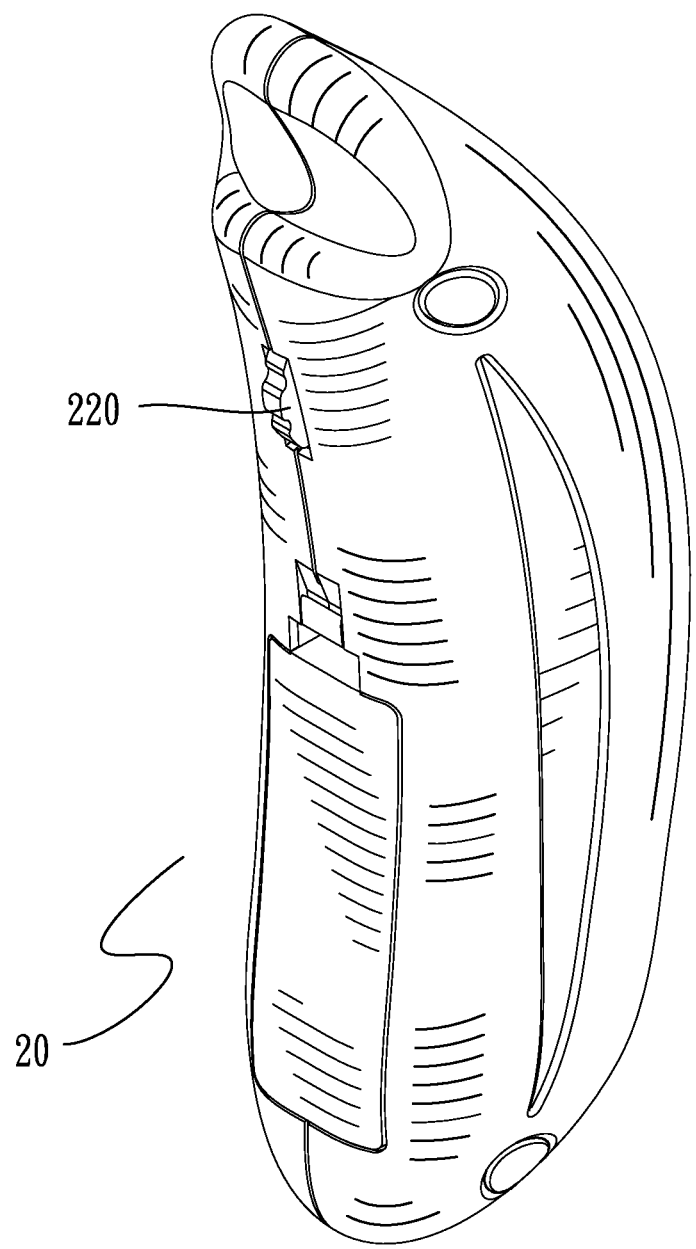
FIG. 11 is another perspective view of a signal receiver of an embodiment according to the present invention.

Refer to FIG. 4, FIG. 10 and FIG. 11, the signal receiver 20 of the present invention includes a signal sensor 210, a control voltage divider 220, a signal strength switch 230, a signal integration module 240, a microcontroller 250 and an indicator light module 260.

The signal sensor 210 having a coil sensor 211 and a capacitor 212 receives the half-sine waves 100 and the off-and-on waves 101 from the signal generator 10. The two ends of the coil sensor 211 and the two ends of the capacitor 212 are connected to the circuit in a parallel connection and a bridge connection.

The control voltage divider 220 consists of a manual adjustment unit 221 and three resistors 222. The control voltage divider 220 is connected to an output circuit of the signal sensor 210. The manual adjustment unit 221 is used to gradually attenuate or amplify the signals received by the signal sensor 210 at multi-stages and filter noises at the same time. The control voltage divider 220 performs multi-stage signal amplification by the manual adjustment unit 221 when the signals received by the signal sensor 210 are weaker than usual. The factors that make strength of the signals received by the signal sensor 210 weaker are the followings. Firstly, there is a plurality of cables around the detected area. Or the detected cable is embedded in a thicker wall. Or more main power switches and more cables connected are in the detected area, or electronics devices nearby cause interference on the detection performance Now the manual adjustment unit 221 is used to amplify amplitude of the half-sine waves 100 and the off-and-on wave 101 so as to be differentiated from the full-sine waves produced by the interference condition mentioned above. On the other hand, when the strength of the signals received by the signal sensor 210 is stronger, the signals are attenuated by the manual adjustment unit 221 so as to adjust the signal to have an ideal waveform by a first-stage fine adjustment. Moreover, the control voltage divider 220 is connected to a ground wire or a terminal end.

The signal strength switch 230 is composed of a two-stage strength switch unit 231, two transistors 232, a plurality of resistors 233 and a plurality of capacitors 234 connected to one another. The signal strength switch 230 is electrically connected to an output circuit of the control voltage divider 220. The above signal amplified by the first-stage fine adjustment is amplified and adjusted by the two-stage strength switch unit 231 so that the half-sine waves are adjusted to get analog signals with larger amplitude. And this is the second-stage adjustment. The two-stage strength switch unit 231 is a circuit switch and the transistor 232 is a signal amplifier.

The control voltage divider 220 is doing attenuation and filtering while the signal strength switch 230 is doing the amplification. Larger attenuation will cause the signal into the transistor weaker. However, it can also largely reduce the noise. Moreover, less stronger signal into the transistor 232 will cause the output signal from the transistor to go weaker. Thus the manual adjustment unit 221 will also affect the performance of amplification from the transistor 232. Therefore, both the manual adjustment unit 221 and the two-stage strength switch unit 231 are amplification units. By the way, each transistor 232 represents one stage of amplification. By the two-stage strength switch unit 231, one stage of the amplifications will be largely reduced. It is almost like cutting one of the amplification stages off.

Figure 5:
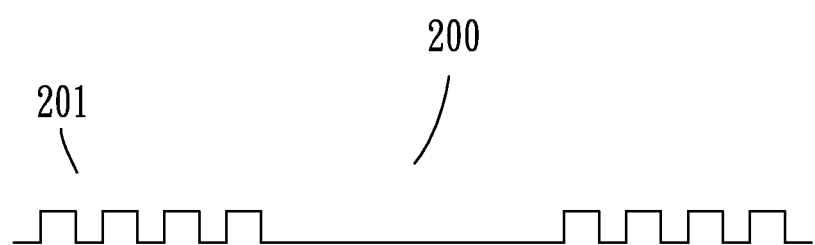
FIG. 5 is a schematic drawing showing waveform of digital signals processed by a signal receiver according to the present invention.

The signal integration module 240 having a plurality of resistors 241, 242 and a differential comparator 243 is electrically connected to an output circuit of the signal strength switch 230 for converting the second-stage amplified analog signals into a set of digital signals 200 with discontinuous square waves 201. As shown in FIG. 5, the discontinuous square waves 201 of the digital signals 200 are converted from the abnormal off-and-on wave 101. The series-connected two resistors 242 are connected to an input terminal of the differential comparator 243 that is preset with a reference voltage value. The comparator 243 compares the voltage passed with the reference voltage value and gives an output signal 0 or 1 based on the comparison result. Then the differential comparator 243 produces and sends a digital signal 200 to the microcontroller 250. A system firmware of an identification system in the microcontroller 250 carries out cross checking of signals and time so as to improve signal identification ability.

Figure 6:
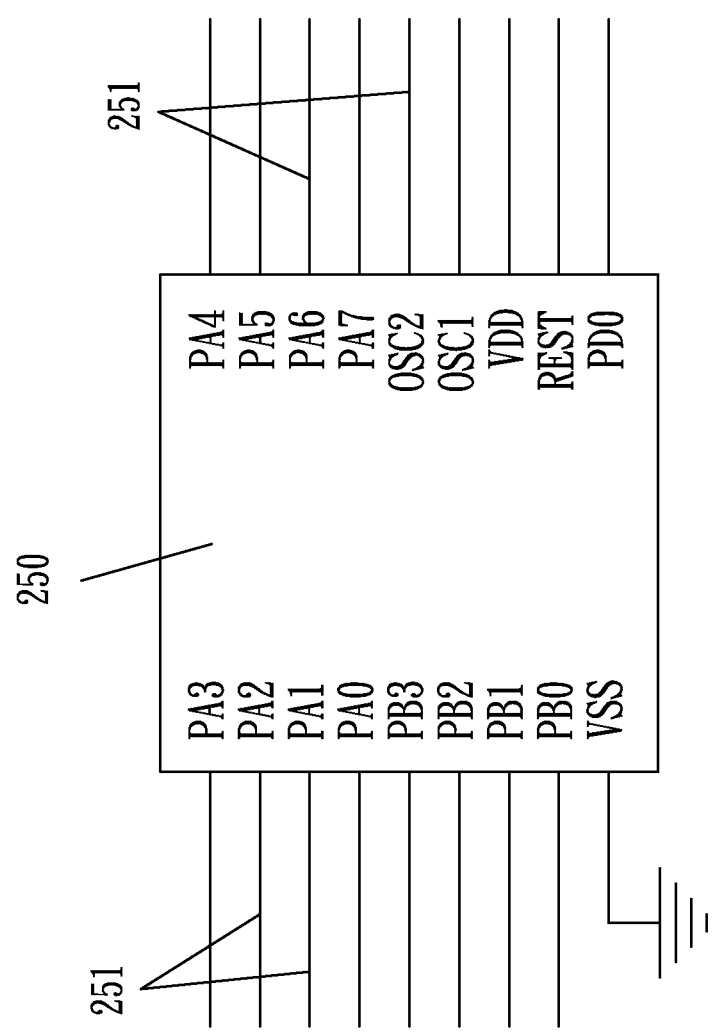
FIG. 6 is a schematic drawing showing a microcontroller of a signal receiver of an embodiment according to the present invention.

Refer to FIG. 4 and FIG. 6, in this embodiment, the microcontroller 250 is a kind of MCU (Micro Controller), or other component with the same functions. A plurality of pines 251 for electrically connected to output terminals of the signal strength switch 230 and the signal integration module 240 of the signal receiver 20 is arranged on a surface of the microcontroller 250. In the figures, each pin 251 of the microcontroller 250 is labeled with letters. The output terminals of the signal strength switch 230 and the signal integration module 240 are also labeled with letters corresponding to the letters of the pins 251 so as to connect with the pins 251 correspondingly.

Figure 7:
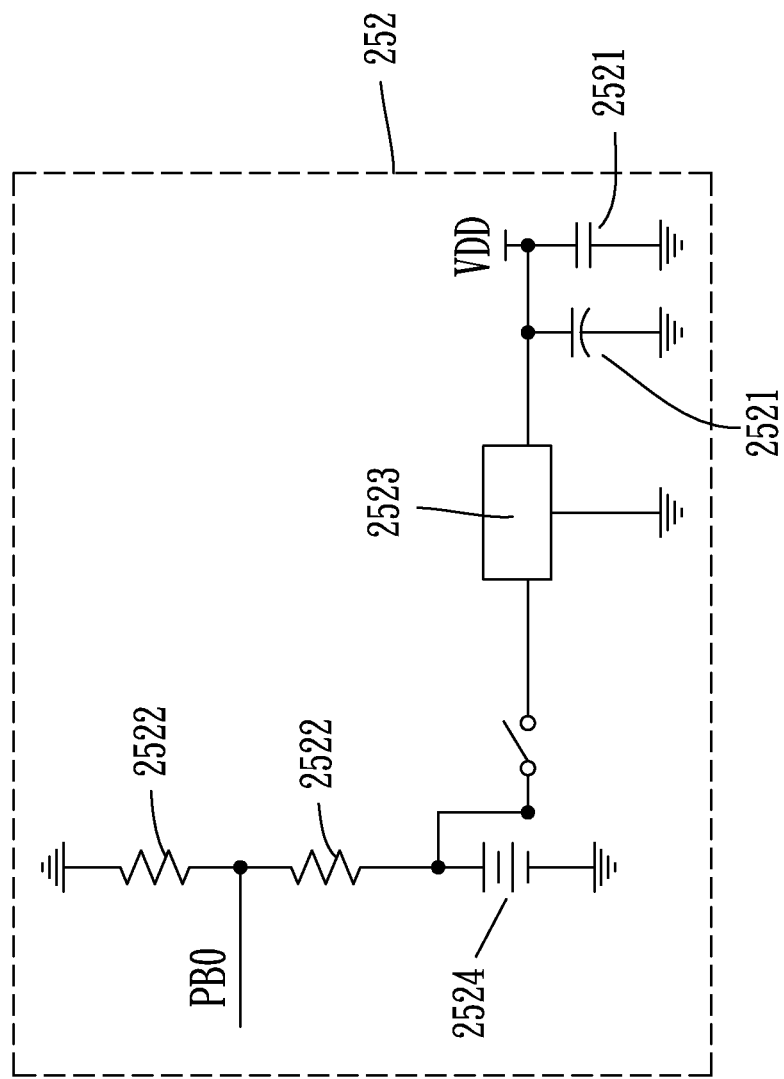
FIG. 7 is a circuit diagram of a rectifier of a signal receiver of an embodiment according to the present invention.

Refer to FIG. 7, the microcontroller 250 is connected to a rectifier 252 that acts on a power supply of the signal receiver 20. The microcontroller 250 consists of a plurality of capacitors 2521, a plurality of resistors 2522, a regulator 2523, and a battery component 2524. By the firmware of the identification system in the microcontroller 250, cross checking of the digital signals 200 with discontinuous square waves 201 output from the signal integration module 240 is carried out. Thus the position of the cable/or main power switch connected correspondingly to the AC power socket being detected can be obtained precisely.

Figure 8:
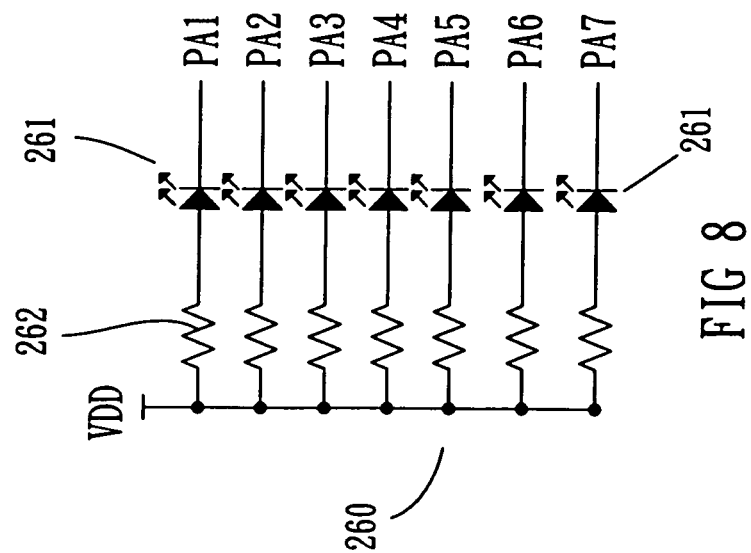
FIG. 8 is a circuit diagram of an indicator light of a signal receiver of an embodiment according to the present invention.

Refer to FIG. 8 and FIG. 10, the indicator light module 260 includes a plurality of indicator lights 261 aligned in a row vertically. One end of each indicator light 261 is connected to a resistor 262, then connected to the same wire in parallel, and finally connected to one of the pins 251 of the microcontroller 250 correspondingly. The other end of each indicator light 261 is respectively connected to the pins 251 of the microcontroller 250. After cross checking of the digital signals 200 from the signal integration module 240 by the firmware of the identification system in the microcontroller 250, the more closer the digital signals 200 to the preset value of the identification system, the more accurate the position of the detected cable/main power switch connected correspondingly to the AC power socket under test. The accuracy is indicated by the height of the position of one of the indicator lights 261 lit up among the indicator light module 260. The higher the indicator light 261 lit up, the more accurate the position of the cable/main power switch. On the other hand, the lower the indicator light 261 lit up, the less the accuracy of the position.

In summary, the signal sensor 210 of the signal receiver 20 receives the half-sine waves 100 and the off-and-on waves 101 from the signal generator 10. Then the signals are amplified and adjusted at two stages by the control voltage divider 220 and the signal strength switch 230. Next the signal integration module 240 outputs the digital signals 200 with discontinuous square waves 201 to the microcontroller 250. Then the firmware of the identification system in the microcontroller 250 carries out cross checking of the digital signals 200. After comparing the digital signals 200 output from the signal integration module 240 with preset data of the microcontroller 250, the closer the two kinds of signals, the higher the position of the indicator light 261 lit up in the indicator light module 260. This means the position of the main power switch connected to the detected power socket correspondingly is more correct. On the other hand, if the position of the indicator light 261 lit up is lower, the position is less correct. Thereby the position of the cable or main power switch (not shown in figure) connected correspondingly to the socket under test can be found out precisely.

Figure 9:
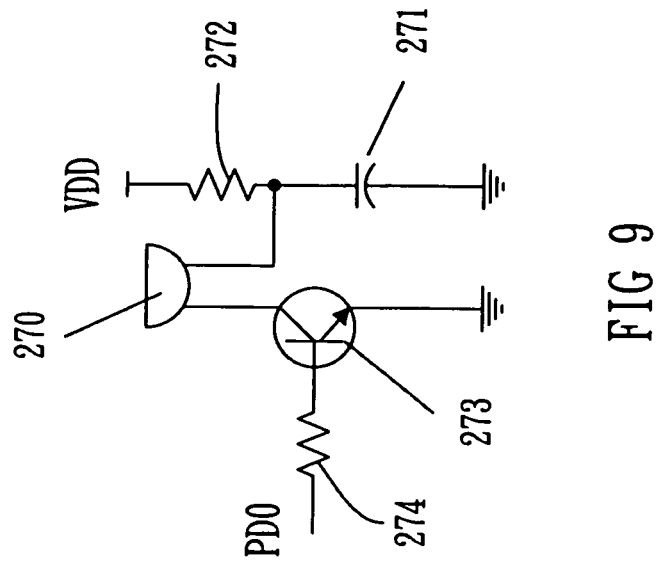
FIG. 9 is a circuit diagram of a buzzer of a signal receiver of an embodiment according to the present invention.

Refer to FIG. 9, in another embodiment, a signal receiver 20 of the present invention further includes a buzzer 270 connected to the microcontroller 250. One end of the buzzer 270 is connected to a capacitor 271 and a resistor 272 while the other end thereof is connected to a transistor 273 and a resistor 274. The buzzer 270 keeps buzzing when the rectifier 252 provides voltage and current to the signal receiver 20 normally. Yet the buzzer 270 stops buzzing when the power is low. Thus the buzzer 270 can be used to check the power status.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. An electrical circuit identification device, comprising: a signal generator directly connected to an AC power socket and a signal receiver set on an area arranged with a plurality of main power switches in a power control panel;
wherein the signal generator includes a power plug, a half-sine pulse generation module, an interval power off and on module, and a signal transmitting module, and produces half-sine waves and off-and-on waves;

wherein the signal receiver includes a signal sensor having an output circuit connected to both a control voltage divider and a signal strength switch for two-stage signal amplification, a signal integration module electrically being connected to the output circuit of the signal strength switch for receiving half-sine wave signals and output a set of digital signals with discontinuous square waves, a microcontroller having an identification system with a firmware and being connected to the output circuit of the signal integration module for cross checking the digital signals output from the signal integration module, an indicator light module being connected to the microcontroller and having a plurality of indicator lights arranged vertically into a row, wherein only one of the indicator lights is lit up during the detection, the higher the position of the indicator light lit up, the higher the accuracy of the position of the cable or main power switch.

2. The device as claimed in claim 1, wherein the power plug of the signal generator is electrically connected to two wires which are connected to the half-sine pulse generation module, wherein each of the two wires is selected from a group consisting of a fuse, a thermistor and a LED.

3. The device as claimed in claim 1, wherein the half-sine pulse generation module includes a rectification diode and two resistors, wherein two ends of the half-sine pulse generation module are respectively connected to the two wires of the power plug, wherein the half-sine pulse generation module blocks a half cycle of sine waves and only a positive half cycle of sine waves is passed.

4. The device as claimed in claim 3, wherein the periodic power off and on module is connected to the two wires on the two ends of the half-sine pulse generation module and comprises a silicon-controlled rectifier (SCR), a silicon diode for alternating current (SIDAC) and a capacitor, wherein the periodic power off and on module sets a short power off and then turns power on immediately at regular intervals so as to produce an off-and-on wave every couple of half-sine waves.

5. The device as claimed in claim 4, wherein the signal transmitting module is connected to the two wires of output ends of the periodic power off and on module and comprises a capacitor and a resistor for transmitting the positive half cycle of sine waves and off-and-on waves.

6. The device as claimed in claim 1, wherein the control voltage divider comprises a manual adjustment unit and three resistors and is connected to an output circuit of the signal sensor so as to attenuate or amplify signals received by the signal sensor at multi-stages.

7. The device as claimed in claim 6, wherein the signal strength switch comprises a strength switch unit, two transistors, a plurality of resistors, and a plurality of capacitors, connected to one another, which is electrically connected to an output circuit of the control voltage divider for second-stage amplification and adjustment of signal strength.

8. The device as claimed in claim 7, wherein the signal integration module comprises a plurality of resistors and a differential comparator which is electrically connected to an output circuit of the signal strength switch, wherein a set of digital signals with discontinuous square waves is sorted out by the differential comparator.

9. The device as claimed in claim 1, wherein the indicator light module includes a plurality of indicator lights arranged vertically into a row, wherein one end of each of the indicator lights is connected to a resistor and then connected to the same wire in parallel, wherien the wire then is connected to a corresponding pin of the microcontroller and the other end of each indictor light is respectively connected to the pins arranged at the microcontroller.

10. The device as claimed in claim 1, wherein the microcontroller is connected to a rectifier for stable power supply.

11. The device as claimed in claim 10, wherein the signal receiver further includes a buzzer connected to the microcontroller, wherein the buzzer keeps buzzing when the rectifier provides power to the signal receiver normally, wherein the buzzer stops buzzing when the power is low.

* * * * *